United States Patent
Chiozzi

(10) Patent No.: US 7,629,753 B2
(45) Date of Patent: Dec. 8, 2009

(54) DEVICE FOR REGULATING THE INTENSITY OF AN ELECTRIC CURRENT

(75) Inventor: Giorgio Chiozzi, Padua (IT)

(73) Assignee: Infineon Technologies, AG, Neubiberg (DE)

( * ) Notice: Subject to any disclaimer, the term of this patent is extended or adjusted under 35 U.S.C. 154(b) by 408 days.

(21) Appl. No.: 11/535,755

(22) Filed: Sep. 27, 2006

(65) Prior Publication Data

US 2008/0169773 A1    Jul. 17, 2008

(30) Foreign Application Priority Data

Sep. 28, 2005   (DE) .................. 10 2005 046 406

(51) Int. Cl.
*H05B 39/04* (2006.01)

(52) U.S. Cl. ....................... 315/291; 315/307

(58) Field of Classification Search ................. 315/291, 315/307; 323/312
See application file for complete search history.

(56) References Cited

U.S. PATENT DOCUMENTS

| | | |
|---|---|---|
| 5,045,902 A | 9/1991 | Bancal |
| 6,054,716 A | 4/2000 | Sonobe et al. |
| 6,501,448 B1 * | 12/2002 | Komiya et al. ................. 345/80 |
| 7,256,422 B2 * | 8/2007 | Yamazaki ....................... 257/59 |
| 2002/0180372 A1 * | 12/2002 | Yamazaki ................. 315/169.3 |
| 2004/0209425 A1 | 10/2004 | Harada |
| 2005/0140308 A1 * | 6/2005 | Park ......................... 315/169.3 |

FOREIGN PATENT DOCUMENTS

| | | |
|---|---|---|
| DE | 3146328 | 6/1983 |
| JP | 02288272 | 11/1990 |
| WO | WO03046996 A1 | 6/2003 |
| WO | WO2005024907 A1 | 3/2005 |

* cited by examiner

*Primary Examiner*—Douglas W Owens
*Assistant Examiner*—Jianzi Chen
(74) *Attorney, Agent, or Firm*—Dicke, Billig & Czaja, PLLC

(57) ABSTRACT

A device for regulating the current intensity of an electric current to be supplied to a load and generated by a current/voltage source is disclosed. In one embodiment, the device includes a semiconductor body, a first electrode, which is connected electrically to the front side of the semiconductor body and can be connected electrically to the current/voltage source, a second electrode, which is connected electrically to the rear side of the semiconductor body and can be connected electrically to the load, a vertical transistor formed in the semiconductor body, by means of which electric current flows between the first and second electrode can be generated/controlled, and a control circuit, which drives the transistor in such a way that the intensities of the current flows between the first and second electrode are regulated to specific values.

22 Claims, 4 Drawing Sheets

DEVICE FOR REGULATING THE INTENSITY OF AN ELECTRIC CURRENT

CROSS-REFERENCE TO RELATED APPLICATIONS

This Utility Patent Application claims priority to German Patent Application No. DE 10 2005 046 406.8 filed on Sep. 28, 2005, which is incorporated herein by reference.

BACKGROUND

The invention relates to a device for regulating the intensity of an electric current to be supplied to a load and generated by a current/voltage source. The invention also relates to an electrical load.

Electrical loads are often connected directly to the current/voltage supply feeding them. The current path between current/voltage supply and electrical load generally has a specific resistance, which can be increased by additional resistors connected into the current path.

In FIG. 1 an arrangement having electrical load 1 and current/voltage supply 2 is illustrated, the electrical load 1 here being a light-emitting diode (LED), which is connected to the current/voltage supply 2 via a resistor R. The resistor R functions as a current limiter.

The disadvantage with the arrangement described in FIG. 1 is that output fluctuations of the current/voltage supply "break through" directly to the light intensity of the light produced by the light-emitting diode 1. A further disadvantage is that, in the event of a fluctuating output of the current/voltage supply 2, the power loss produced in the light-emitting diode 1, and therefore the temperature prevailing in the light-emitting diode 1, varies highly, which means that the diode 1 has to be designed for a high thermal loadbearing capacity.

In order to counter this problem, it is known to connect a device 3 for regulating the current intensity of the current generated by the current/voltage supply 2 into the current path between the current/voltage supply 2 and the electrical load 1, as illustrated in FIG. 2 ("active current source"). The device 3 has a control circuit for regulating the current intensity, which is integrated into a semiconductor chip 4. The semiconductor chip 4 is mounted on a carrier 5, an insulating layer 6 being provided between the carrier 5 and the semiconductor chip 4. Contact is made with the semiconductor chip 4 on its upper side by means of bonding wires 7, which are connected electrically to connecting legs 8. The entire device 3 is enclosed by a housing 9.

The arrangement illustrated in FIG. 2 has, as already mentioned, the advantage that the light-emitting diode 1 is supplied with a constant input current. However, the fact that the costs of the housing 9 and the costs for mounting the semiconductor chip and the carrier 5 in the housing 9 are relatively high is disadvantageous.

For these and other reasons, there is a need for the present invention.

SUMMARY

One embodiment provides a device for regulating the current intensity of an electric current to be supplied to a load and generated by a current/voltage source. One embodiment includes a semiconductor body, a first electrode, which is connected electrically to the front side of the semiconductor body and can be connected electrically to the current/voltage source, a second electrode, which is connected electrically to the rear side of the semiconductor body and can be connected electrically to the load, a vertical transistor formed in the semiconductor body, by means of which electric current flows between the first and second electrode can be generated/controlled, and a control circuit, which drives the transistor in such a way that the intensities of the current flows between the first and second electrode are regulated to specific values.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
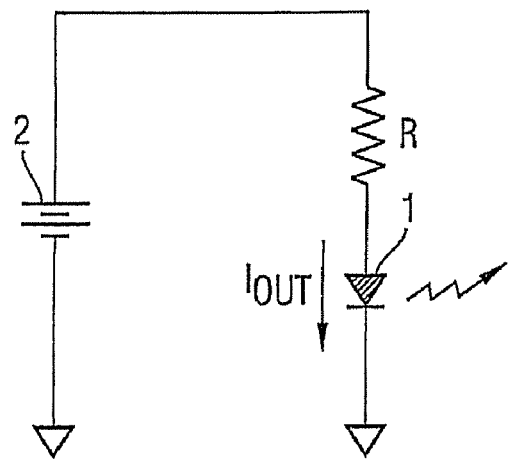
FIG. 1 illustrates an equivalent circuit diagram of a known arrangement having current/voltage source, resistor and light-emitting diode.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a device for regulating the current intensity of an electric current to be supplied to a load and generated by a current/voltage source which can be produced cost-effectively.

In one embodiment, the device according to the invention for regulating the current intensity of an electric current to be supplied to a load and generated by a current/voltage source includes:

a semiconductor body, a first electrode, which is connected electrically to the front side of the semiconductor body and can be connected electrically to the current/voltage source, a second electrode, which is connected electrically to the rear side of the semiconductor body and can be connected electrically to the load, a vertical transistor formed in the semiconductor body, by means of which electric current flows between the first and second electrode can be generated/controlled, and a control circuit, which drives the transistor in such a way that the intensities of the current flows between the first and second electrode are regulated to specific values.

In one embodiment, the first electrode adjoins the front side of the semiconductor body directly. In an analogous way, the second electrode can adjoin the rear side of the semiconductor body directly. The construction of a device with a vertical structure is simpler, seen from the point of view of fabrication, than the production of a device with a planar structure.

The surface extents of the first and/or second electrode should correspond to the dimensions of the front side and rear side, respectively, of the semiconductor body. Therefore, as compared with a lateral configuration of the device, relatively large contact areas (each electrode can be extended to the entire surface which is formed by the front side and rear side of the semiconductor body; therefore, as compared with a current intensity regulating device with a planar structure, twice the base area is available for the electrodes) are available for connecting the device to the current/voltage source and to the electrical load, respectively, which makes appropriate contact-making processes of the device easier.

Figure 2:
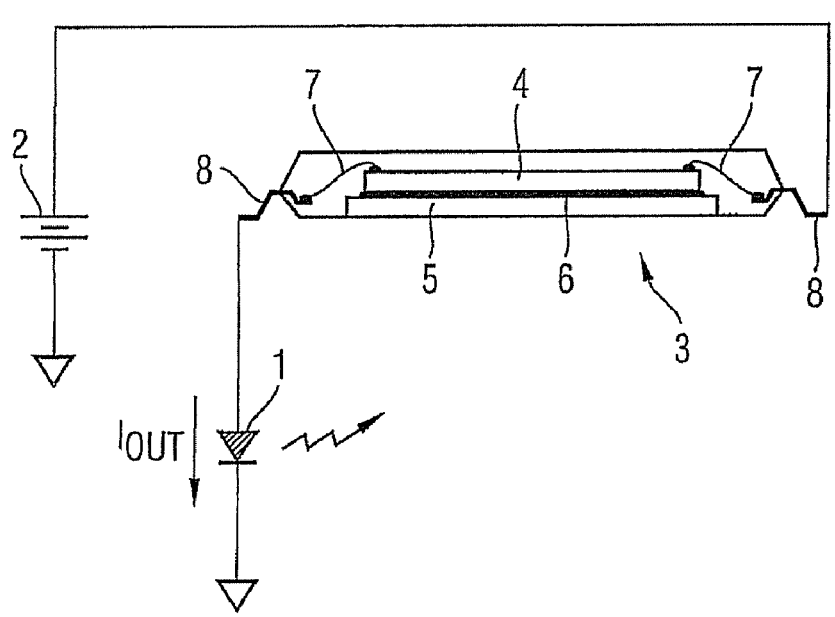
FIG. 2 illustrates a schematic illustration of a known arrangement having current/voltage source, current limiter and light-emitting diode.

Bonding processes for connecting the device to the electrical connections, as is necessary in the device illustrated in FIG. 2, are dispensed with.

The transistor can be, for example, a MOS (metal oxide semiconductor) transistor or bipolar transistor. However, the invention is not restricted thereto. In one embodiment, the emitter or the source region of the transistor is connected electrically to the first electrode, and the collector or the drain region of the transistor is connected electrically to the second electrode.

Between the first electrode and the front side of the semiconductor body, there can be arranged an insulating layer, which is pierced by an electric leadthrough in such a way that the emitter or the source region is connected electrically to the first electrode via the electric leadthrough.

The control circuit for driving the transistor is integrated into the semiconductor body. In order to be able to drive the transistor, the control circuit in this case must be connected electrically to the base or the gate electrode. If an insulating layer is arranged between the first electrode and the front side of the semiconductor body and/or between the second electrode and the outside of the semiconductor body, then an appropriate electrical connection between the control circuit and the base or gate electrode can run within the insulating layer. The same is true in an analogous way of electrical connections between the control circuit and the emitter or source region or the connector or the drain region of the transistor. Within the insulating layers, it is therefore possible for "component wiring planes" to be provided for connecting transistor and control circuit or for fulfilling other purposes. Alternatively, it is possible to connect the emitter or source region and also the collector or the drain region of the transistor to the control circuit via the first and second electrode.

The semiconductor body preferably consists of silicon, which has good mechanical stability, but can also consist of other materials.

The invention also provides an electrical load which has a contact via which an electric current can be supplied to the load. The electrical load is distinguished by the fact that it is provided with a device according to the invention for regulating the current intensity of an electric current, the second electrode of the device being connected electrically to the contact of the load, and it being possible for the first electrode to be connected to a current/voltage source.

The contact of the electrical load is configured as a contact area, on which the second electrode of the device according to the invention rests directly. The advantage of such an electrical load is that the "ensemble" can be produced extremely simply in fabrication terms. Furthermore, the dimensions of the ensemble can be kept small. Finally, it is possible to dispense with a housing for holding the device, which reduces the production costs further.

The electrical load can in principle be any desired load. However, the invention can be used in particular in conjunction with an LED component as electrical load.

In the figures, identical or mutually corresponding regions, components or component groups are identified by the same reference numbers. Furthermore, the doping types of the semiconductor regions in all the embodiments can be configured inversely, that is to say p-regions can be replaced by n-regions and vice versa.

Figure 3:
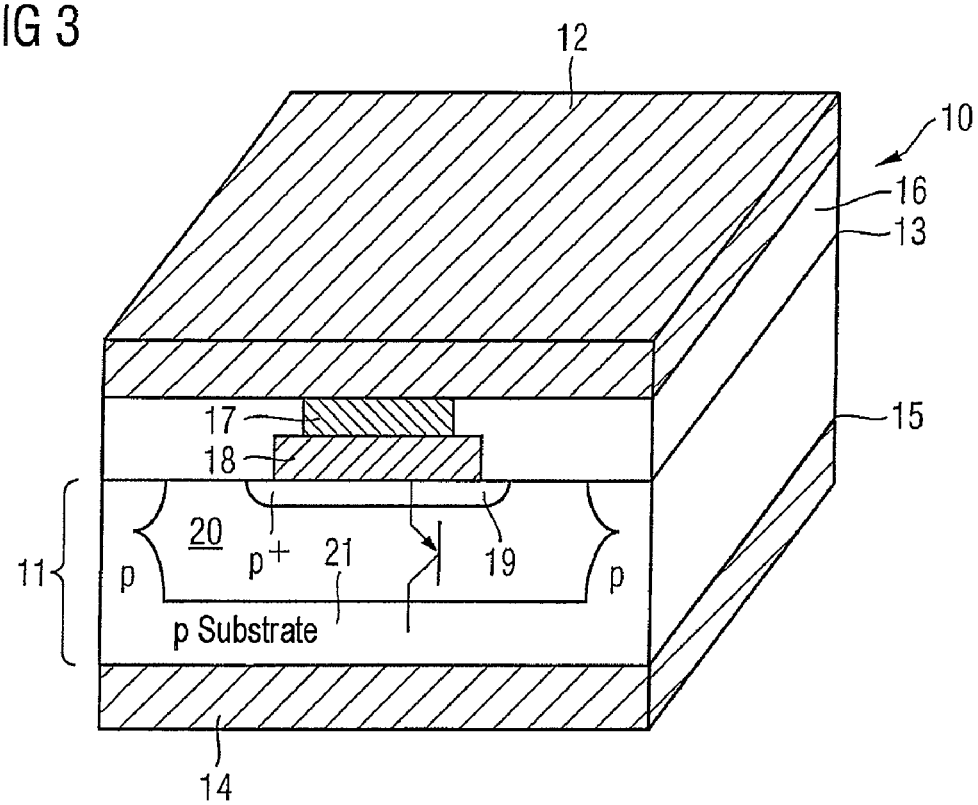
FIG. 3 illustrates one embodiment of the device according to the invention.

One embodiment of the device according to the invention is illustrated in FIG. 3. A device 10 has a semiconductor body 11, a first electrode 12, which is connected electrically to the front side 13 of the semiconductor body 11, a second electrode 14, which is connected electrically to the rear side 15 of the semiconductor body 11, an insulating layer 16, which is arranged between the first electrode 12 and the front side 13 of the semiconductor body 11, an electrical leadthrough 17 and a wiring structure 18, the electric leadthrough 17 ("via") and the wiring structure 18 being arranged within the insulating layer 16. Formed within the semiconductor body 11 is a vertical pnp transistor, which consists of a $p^+$-doped emitter 19, an n-doped base 20 and a p-doped collector 21.

By means of the vertical transistor, the intensity of an electric current which flows through the semiconductor body 11 from the first electrode 12 to the second electrode 14 can be controlled.

The first electrode 12 is connected electrically via the electrical leadthrough 17 and the wiring structure 18 to the emitter 19 of the vertical transistor. The wiring structure 18 can, for example, also fulfill the purpose of connecting a control circuit (not shown here) electrically to the emitter 19. Furthermore, via the wiring structure 18, the base 20 of the vertical transistor can be connected to the control circuit (not shown here). The wiring structure 18 can therefore be used to the same extent for connecting emitter 19, base 20 and collector 21 to the control circuit.

Figure 5:
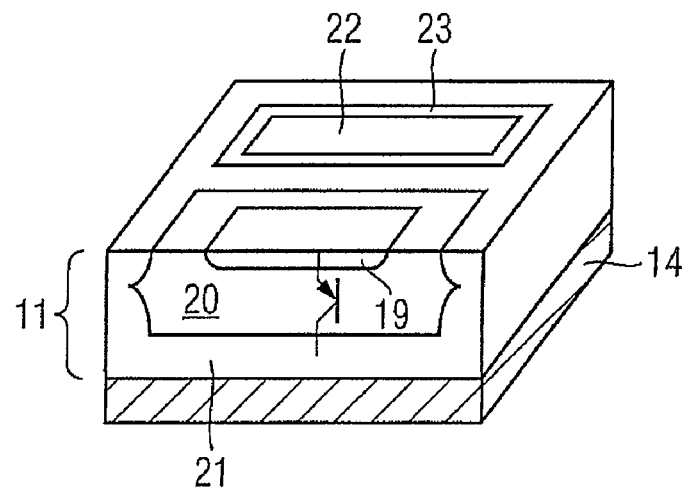
FIG. 5 illustrates a detailed illustration of the device according to the invention illustrated in FIG. 3.

Illustrated in FIG. 5 is an embodiment of the device illustrated in FIG. 3, in which the control circuit 22 (in a preferably planar embodiment) is integrated directly into the semiconductor body 11, the control circuit 22 being insulated electrically with respect to the semiconductor body 11 by an insulating layer 23. On the left of the dashed line L, the control circuit 22 can be seen, on the right of the dashed line, L the vertical transistor 24 can be seen. The control circuit 22 is connected electrically to the base 20 and to the emitter 19 via the wiring structure 18. The connection of the collector 21 to the control circuit 22 is carried out via the second electrode 14.

However, the control circuit 22 can also be provided at another point, for example in an external chip, which is connected to the device 10 mechanically and also electrically (for example in the form of a "chip on chip" arrangement).

Figure 6:
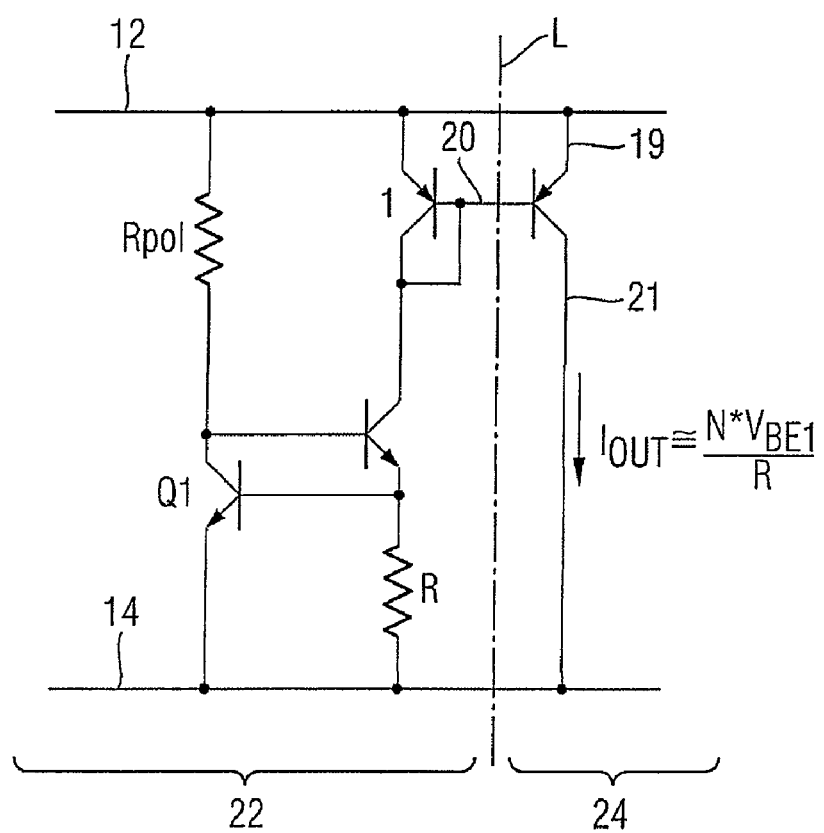
FIG. 6 illustrates an equivalent circuit diagram of a control circuit which can be used in the devices according to the invention illustrated in FIGS. 3 and 5.

Configuration of the control circuit 22 is illustrated in FIG. 6. In principle, any desired control circuits can be used.

The device 10 illustrated in FIG. 3 is distinguished by extremely compact dimensions and by high mechanical ruggedness. Since the first and second electrode 12, 14 can be used both as electrical contacts and as mechanical supporting surfaces, it is possible to dispense with a housing enclosing the device 10, as illustrated in FIG. 2. Therefore, the production costs can be reduced considerably. In addition, the production process can be simplified in this way.

Figure 4:
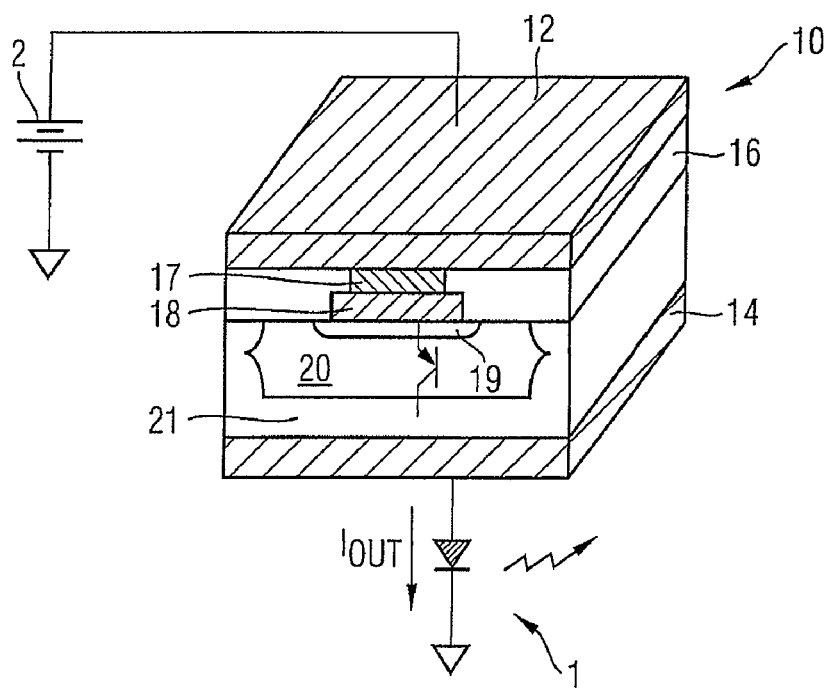
FIG. 4 illustrates a schematic illustration of an arrangement having current/voltage source, light-emitting diode and the device illustrated in FIG. 3.

FIG. 4 illustrates (schematically) how the device 10 illustrated in FIG. 3 can be wired up to a current/voltage supply 2 and an electrical load 1.

Figure 7:
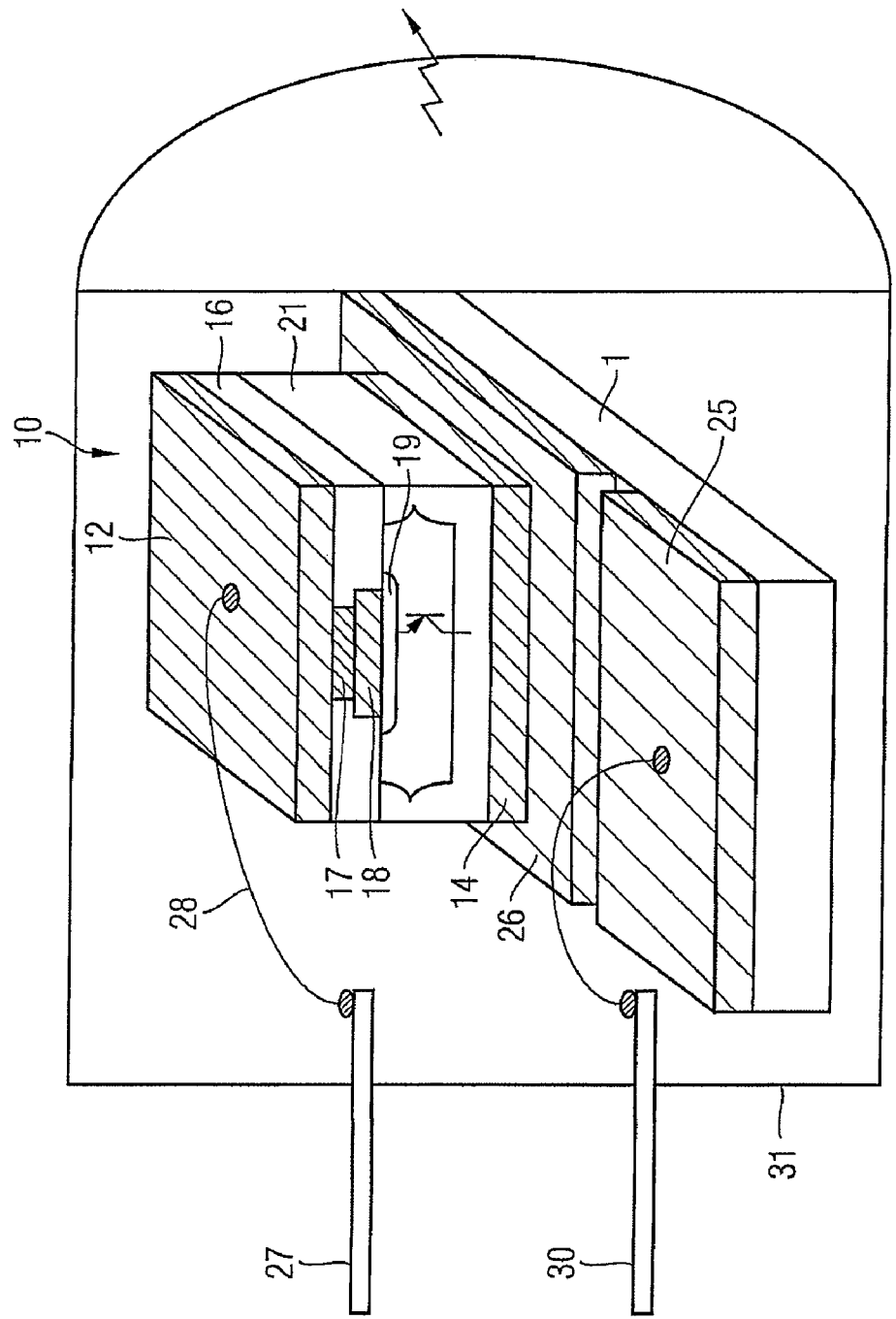
FIG. 7 illustrates one possible implementation of the arrangement indicated schematically in FIG. 4.

One possible implementation of the ensemble illustrated in FIG. 4 is illustrated in FIG. 7. It is possible to see a light-emitting diode 1, which represents an electrical load, two contact areas 25 and 26 isolated electrically from each other being provided on the upper side of the light-emitting diode 1. In this case, the contact area 26 is used as a contact for supplying an electric current provided by a current/voltage supply (not shown here), which is supplied via the line 27. Connected between the line 27 and the contact area 26 is the device 10 illustrated in FIG. 3, the second electrode 14 resting directly on the contact area 26. The first electrode 12 of the device 10 is connected electrically to the line 27 via a bonding wire 28. The first contact area 25 is connected electrically to a line 30 via a bonding wire 29 and is used to close the current loop.

As can be gathered from FIG. 7, the device 10 does not need a separate housing and can be wired up to the electrical load 1 in an extremely simple way. The entire arrangement illustrated in FIG. 7 can be enclosed by a housing 31.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for regulating the current intensity of an electric current to be supplied to a load and generated by a current/voltage source, comprising:
    an electrical load including first and second contact areas isolated electrically from each other;
    a semiconductor body;
    a first electrode, which is connected electrically to the front side of the semiconductor body and is connected electrically to the current/voltage source;
    a second electrode, which is connected electrically to the rear side of the semiconductor body and is provided on the second contact area of the load;
    a vertical transistor formed in the semiconductor body, by means of which electric current flows between the first and second electrode can be controlled; and
    a control circuit, which is formed in the semiconductor body and drives the transistor in such a way that the intensities of the current flows between the first and second electrode are regulated to specific values; and
    a housing which encloses the electrical load and the semiconductor device.

2. The device as claimed in claim 1, comprising wherein the transistor is a MOS transistor or a bipolar transistor.

3. The device as claimed in claim 1, comprising the emitter/the source region of the transistor is connected electrically to the first electrode, and the collector/the drain region of the transistor is connected electrically to the second electrode.

4. The device as claimed in claim 1, comprising an insulating layer arranged between the first electrode and the front side of the semiconductor body, the emitter/the source region being connected electrically to the first electrode via an electrical lead through which pierces the insulating layer.

5. The device as claimed in claim 1, comprising wherein the first and/or second electrode adjoins the front side and rear side, respectively, of the semiconductor body directly.

6. The device as claimed in claim 1, comprising wherein the surface extents of the first and/or second electrode correspond to the extents of the front side and rear side, respectively, of the semiconductor body.

7. The device as claimed in claim 1, comprising wherein the control circuit for driving the transistor is integrated into the semiconductor body.

8. The device as claimed in claim 7, comprising where the control circuit is connected to the base/the gate electrode and/or the emitter/the source region of the transistor by electric lines, which are insulated electrically with respect to the first and second electrode.

9. The device as claimed in claim 7, comprising where the control circuit is connected electrically to the first and second electrode.

10. The device as claimed in one of claim 1, wherein the semiconductor body consists of silicon.

11. An electrical load, having a contact, via which an electric current can be supplied to the electrical load, which comprises:
    a device for regulating the current intensity of an electric current to be supplied to a load and generated by a current/voltage source, comprising a semiconductor body, a first electrode, which is connected electrically to the front side of the semiconductor body and can be connected electrically to the current/voltage source, a second electrode, which is connected electrically to the rear side of the semiconductor body and can be connected electrically to the load, a vertical transistor formed in the semiconductor body, by means of which electric current flows between the first and second electrode can be generated/controlled, and a control circuit, which drives the transistor in such a way that the intensities of the current flows between the first and second electrode are regulated to specific values,
    of which the second electrode is connected electrically to the contact of the load, and of which the first electrode can be connected to a current/voltage source.

12. The electrical load as claimed in claim 11, comprising configuring the contact as a contact area and the second electrode rests directly on the contact area.

13. The electrical load as claimed in claim 11, comprising wherein the electrical load is an LED component.

14. A semiconductor device comprising:
    a semiconductor body;
    a first electrode, which is connected electrically to the front side of the semiconductor body;
    a second electrode, which is connected electrically to the rear side of the semiconductor body;
    a vertical transistor which is formed in the semiconductor body, by means of which electric current flows between the first and second electrode can be controlled;

a control circuit configured for driving the transistor such that the intensities of the current flows between the first and second electrode are regulated to specific values; and wherein in order to regulate the current intensity of an electric current to be supplied to a load and generated by a current/voltage source, the first electrode is connected electrically to the current/voltage source and the second electrode is connected electrically to the load.

15. The device as claimed in claim 14, comprising wherein the transistor is a MOS transistor or a bipolar transistor.

16. The device as claimed in claim 14, comprising the emitter/the source region of the transistor is connected electrically to the first electrode, and the collector/the drain region of the transistor is connected electrically to the second electrode.

17. The device as claimed in claim 16, comprising an insulating layer arranged between the first electrode and the front side of the semiconductor body, the emitter/the source region being connected electrically to the first electrode via an electrical lead through which pierces the insulating layer.

18. The device as claimed in claim 17, comprising wherein the first and/or second electrode adjoins the front side and rear side, respectively, of the semiconductor body directly.

19. The device as claimed in claim 18, comprising wherein the surface extents of the first and/or second electrode correspond to the extents of the front side and rear side, respectively, of the semiconductor body.

20. The device as claimed in claim 19, comprising wherein the control circuit for driving the transistor is integrated into the semiconductor body.

21. The device as claimed in claim 20, comprising where the control circuit is connected to the base/the gate electrode and/or the emitter/the source region of the transistor by electric lines, which are insulated electrically with respect to the first and second electrode, where the control circuit is connected electrically to the first and second electrode.

22. A device for regulating the current intensity of an electric current to be supplied to a load and generated by a current/voltage source, comprising:

a semiconductor body;

a first electrode, which is connected electrically to the front side of the semiconductor body and can be connected electrically to the current/voltage source;

a second electrode, which is connected electrically to the rear side of the semiconductor body and can be connected electrically to the load;

first means for generating/controlling electric current flows between the first and second electrode; and second means for driving the first means in such a way that the intensities of the current flows between the first and second electrode are regulated to specific values.

* * * * *